United States Patent
Vinokor et al.

(10) Patent No.: US 7,285,732 B2
(45) Date of Patent: Oct. 23, 2007

(54) ULTRA-LOW HEIGHT ELECTROMAGNETIC SHIELDING ENCLOSURE

(75) Inventors: Igor Vinokor, Skokie, IL (US); Vladislav Pirkhalo, Vernon Hills, IL (US); Anatoliy Shlahtichman, Buffalo Grove, IL (US); Eugene Smyk, Crystal Lake, IL (US); Zoilo Anthony Favela, Chicago, IL (US); Gerald English, Glen Ellyn, IL (US)

(73) Assignee: Laird Technologies, Inc., Delaware Water Gap, PA (US)

( * ) Notice: Subject to any disclaimer, the term of this patent is extended or adjusted under 35 U.S.C. 154(b) by 0 days.

(21) Appl. No.: 11/495,995

(22) Filed: Jul. 28, 2006

(65) Prior Publication Data

US 2007/0012479 A1 Jan. 18, 2007

Related U.S. Application Data

(63) Continuation of application No. 11/044,934, filed on Jan. 27, 2005, now Pat. No. 7,109,411.

(60) Provisional application No. 60/540,180, filed on Jan. 29, 2004.

(51) Int. Cl.
*H05K 9/00* (2006.01)
(52) U.S. Cl. ........................ 174/382; 174/377
(58) Field of Classification Search ................ 174/377, 174/382, 384, 387; 361/816, 818
See application file for complete search history.

(56) References Cited

U.S. PATENT DOCUMENTS

| | | | |
|---|---|---|---|
| 4,754,101 A | 6/1988 | Stickney et al. | |
| 5,032,689 A | 7/1991 | Halligan et al. | |
| 5,354,951 A | 10/1994 | Lange, Sr. et al. | |
| 5,383,098 A | 1/1995 | Ma et al. | |
| 5,422,433 A | 6/1995 | Rivera et al. | |
| 5,436,802 A | 7/1995 | Trahan et al. | |
| 5,530,202 A | 6/1996 | Dais et al. | |
| 5,704,117 A * | 1/1998 | Mok et al. | 29/841 |
| 6,235,985 B1 | 5/2001 | Dai | |
| 6,362,417 B2 | 3/2002 | Mitchell et al. | |
| 6,390,320 B2 | 5/2002 | Hurst et al. | |
| 2005/0141211 A1* | 6/2005 | Chen | 361/816 |

* cited by examiner

*Primary Examiner*—Hung V. Ngo
(74) *Attorney, Agent, or Firm*—Harness, Dickey & Pierce, P.L.C.

(57) ABSTRACT

The electromagnetic shielding device includes a frame and a lid. The frame includes sidewalls and upstanding male detent elements with outwardly extending detent protrusions. The lid includes a generally planar top with peripheral lip portions. Slots are formed at the intersection of the lid and the peripheral lip portions so that upstanding male detent elements can extend therethrough and detent engage the frame to the lid. Variations of the detent engagement are shown in different embodiments, by which can be achieved a reduced height of the electromagnetic shielding device.

20 Claims, 4 Drawing Sheets

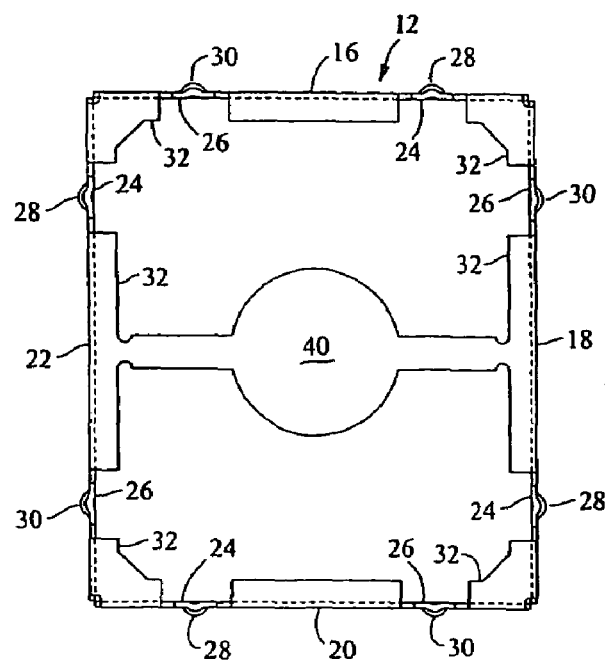
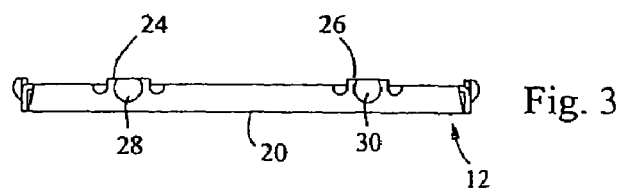
Fig. 2
Fig. 3
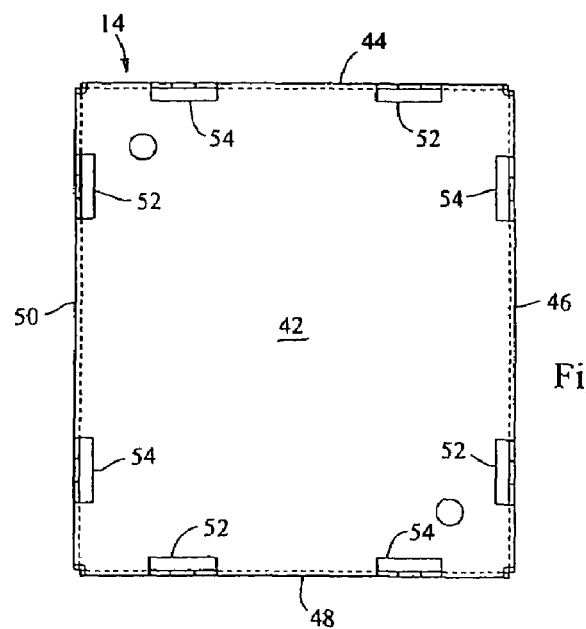
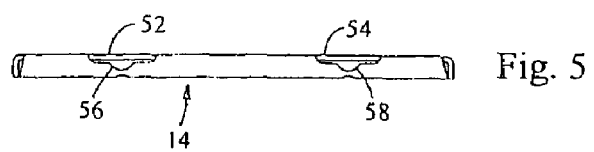
Fig. 4
Fig. 5

ULTRA-LOW HEIGHT ELECTROMAGNETIC SHIELDING ENCLOSURE

CROSS-REFERENCE TO RELATED APPLICATIONS

This application is a continuation of presently allowed U.S. patent application Ser. No. 11/044,934 filed Jan. 27, 2005 now U.S. Pat. No 7,109,411 which, in turn, claimed priority to U.S. Provisional Patent Application No. 60/540, 180 filed Jan. 29, 2004.

This application claims the benefit of PCT International Patent Application No. PCT/US2005/002997 filed Jan. 27, 2005, which, in turn, claimed priority to U.S. Provisional Patent Application No. 60/540,180 filed Jan. 29, 2004.

The disclosures of the above applications are incorporated herein by reference.

FIELD

The present disclosure generally relates multi-piece electromagnetic shielding assemblies including a frame and cover, which can used as an enclosure for shielding electromagnetic radiation from exiting or entering an electronics package of a printed circuit board.

BACKGROUND

The statements in this section merely provide background information related to the present disclosure and may not constitute prior art.

Electronic equipment typically includes electrical components and circuits mounted on a substrate that can be sensitive to electromagnetic interference (EMI) and radio frequency interference (RFI). Such EMI/RFI interference may originate from internal sources within the electronic equipment or from external EMI/RFI interference sources. Interference can cause degradation or complete loss of important signals, thereby rendering the electronic equipment inefficient or inoperable. Accordingly, the circuits (sometimes referred to as RF modules or transceiver circuits) usually require EMI/RFI shielding in order to function properly. The shielding reduces interference not only from external sources, but also from various functional blocks within the module. By way of example, electronic circuits or components of a printed circuit board (PCB) are often enclosed with shields to localize EMI within its source, and to insulate other devices proximal to the EMI source.

As used herein, the term "EMI" should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to a housing or other enclosure in which electronic equipment is disposed.

SUMMARY

According to various aspects, exemplary embodiments are provided of shielding enclosures. In one exemplary embodiment, a shielding enclosure generally includes a frame with an open top, and a lid to cover the frame's open top. The frame includes side walls having elements extending upwardly above the open top. The elements include lateral detent protrusions above the open top. The lid includes a downwardly extending lip which surrounds the frame and has semi-circular cut-out portions in which the lateral detent protrusions nest to engage the elements extending upwardly above the open top.

In another exemplary embodiment, a shielding enclosure generally includes a frame with an open top, and a lid to cover the frame's open top. The frame includes side walls having elements extending upwardly above the open top. The elements have lateral detent protrusions thereon. The lid includes slots in which are received the elements extending upwardly above the open top of the frame. The lid also includes a downwardly extending lip that surrounds the frame. The lip has cut-out portions in which the lateral detent protrusions nest, for engaging the elements extending upwardly above the open top of the frame.

In another exemplary embodiment, a shielding enclosure generally includes a frame with an open top, and a lid to cover the open top of the frame. The frame includes side walls and a fillet radius extending generally between the side walls and the open top. The frame's side walls include upwardly extending elements that extend above the open top. The upwardly extending elements have cut-out portions therein. The lid includes a downwardly extending lip that surrounds the frame. The lip has flanges extending upwardly from the lip. The flanges include lateral detent protrusions that nest within the frame's cut-out portions, for engaging the upwardly extending elements of the frame.

Other aspects relate to methods of using shielding enclosure. One exemplary embodiment is generally directed to a method of using an EMI shielding enclosure that includes a frame and a cover. The frame has side walls with elements that extend upwardly above the top of the frame, which elements have a first retaining feature therein. The cover has a downwardly extending lip with flanges extending upwardly therefrom, which flanges have a second mating feature therein. The method generally includes positioning the cover relative to the frame such that the first retaining feature of the frame's upwardly extending elements engage the second retaining feature of the flanges extending upwardly from the cover, to thereby retain the cover on the frame.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

FIG. 2 is a top plan view of the frame shown in FIG. 1A;

FIG. 3 is a plan view of the front of the frame shown in FIG. 1A;

FIG. 4 is a top plan view of the lid shown in FIG. 1A;

FIG. 5 is a plan view of the front of the lid shown in FIG. 1A;

DETAILED DESCRIPTION

Figure 1A:
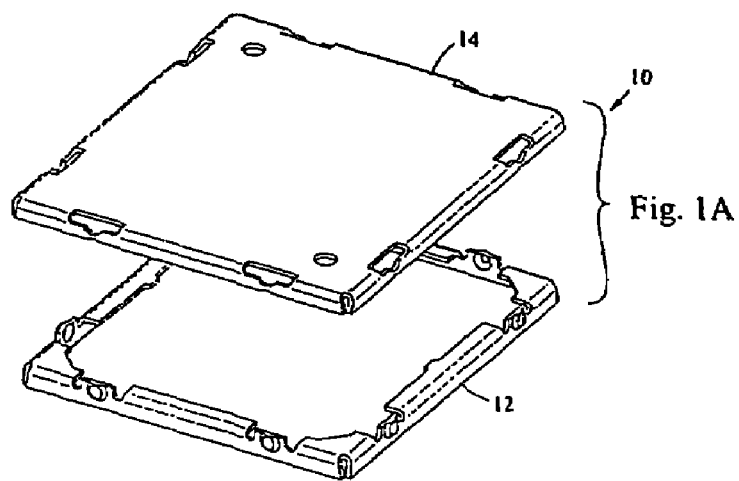
FIG. 1A is an exploded view of a lid and frame of a shielding device according to a first exemplary embodiment.
Figure 1B:
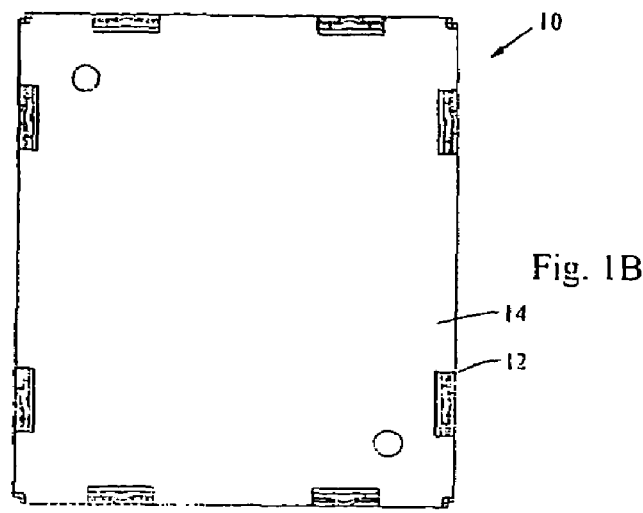
FIG. 1B is a top plan view of the engaged lid and frame of the shielding device shown in FIG. 1A.
Figure 1C:
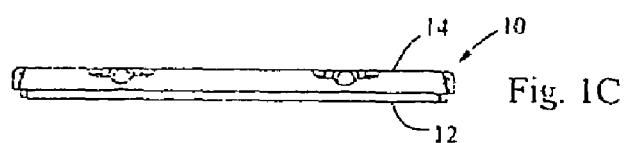
FIG. 1C is a side plan view of the engaged lid and frame of the shielding device shown in FIG. 1A.
Figure 1D:
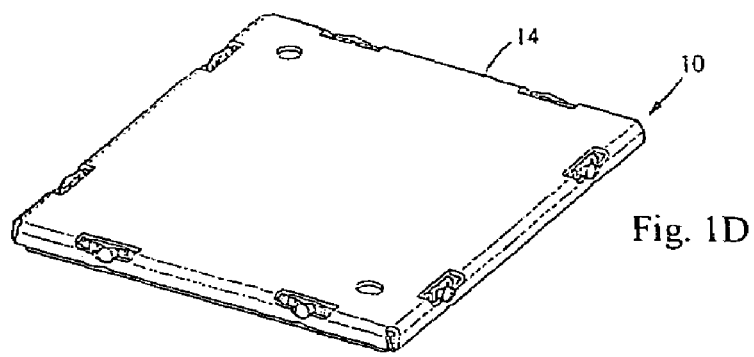
FIG. 1D is a perspective view of the engaged lid and frame of the shielding device shown in FIG. 1A.

The following description is merely exemplary in nature and is in no way intended to limit the present disclosure, application, or uses. It should be understood that throughout the drawings, corresponding reference numerals indicate like or corresponding parts and features.

According to various aspects, exemplary embodiments are provided of shielding enclosures. In one exemplary embodiment, a shielding enclosure generally includes a frame with an open top, and a lid to cover the frame's open top. The frame includes side walls having elements extending upwardly above the open top. The elements include lateral detent protrusions above the open top. The lid includes a downwardly extending lip which surrounds the frame and has semi-circular cut-out portions in which the lateral detent protrusions nest to engage the elements extending upwardly above the open top.

In another exemplary embodiment, a shielding enclosure generally includes a frame with an open top, and a lid to cover the frame's open top. The frame includes side walls having elements extending upwardly above the open top. The elements have lateral detent protrusions thereon. The lid includes slots in which are received the elements extending upwardly above the open top of the frame. The lid also includes a downwardly extending lip that surrounds the frame. The lip has cut-out portions in which the lateral detent protrusions nest, for engaging the elements extending upwardly above the open top of the frame.

In another exemplary embodiment, a shielding enclosure generally includes a frame with an open top, and a lid to cover the open top of the frame. The frame includes side walls and a fillet radius extending generally between the side walls and the open top. The frame's side walls include upwardly extending elements that extend above the open top. The upwardly extending elements have cut-out portions therein. The lid includes a downwardly extending lip that surrounds the frame. The lip has flanges extending upwardly from the lip. The flanges include lateral detent protrusions that nest within the frame's cut-out portions, for engaging the upwardly extending elements of the frame.

Other aspects relate to methods of using shielding enclosure. One exemplary embodiment is generally directed to a method of using an EMI shielding enclosure that includes a frame and a cover. The frame has side walls with elements that extend upwardly above the top of the frame, which elements have a first retaining feature therein. The cover has a downwardly extending lip with flanges extending upwardly therefrom, which flanges have a second mating feature therein. The method generally includes positioning the cover relative to the frame such that the first retaining feature of the frame's upwardly extending elements engage the second retaining feature of the flanges extending upwardly from the cover, to thereby retain the cover on the frame.

Accordingly, various embodiments can provide electromagnetic interference shielding for a component on a printed circuit board. Some embodiments provide a shielding device may have a very low height from the printed circuit board, particularly when used with mobile handsets or similar applications where there is typically not enough room for devices with a greater height. Some embodiments provide a shielding device wherein reduced stress is placed on the device during assembly. Some embodiments provide shielding devices that can be manufactured and assembled with relatively low manufacturing and assembly costs low.

In one exemplary embodiment, a shielding device generally includes a frame and a lid. The height of the shielding device may be as low as 0.9 millimeter, and may typically be 1.4 millimeters. The frame may include four sidewalls that extend upwardly from the printed circuit board and include male detent elements or protrusions. A top or upper portion of the frame is generally open with a support extending thereacross. The lid has roughly the same footprint as the frame, with a planar top and a peripheral downwardly extending lip that engages the top or upper periphery of the frame. Slots may be formed in the intersection between the planar top and the downwardly extending lip. These slots of the lid may be engaged by the male detent protrusions of the frame in the installed position. Variations in the detent engagement are also disclosed herein.

Referring now to FIGS. 1A through 1D, there is shown various views of a first exemplary embodiment of a shielding device 10 embodying one or more aspects of the present disclosure. As shown, the shielding device 10 includes a frame 12 and a lid 14 engageable to the frame 12. The frame 12 and lid 14 are typically formed from electrically conductive sheet metal or other suitable materials.

The frame 12 is shown in more detail in FIGS. 2 and 3. In this particular illustrated embodiment, the frame 12 includes four upright sidewalls 16, 18, 20, 22 in a generally rectangular or square configuration and is configured to attach on its lower side to a circuit board (not shown) so as to surround the electromagnetic device (not shown) being shielded. Sidewalls 16, 18, 20, 22 may have a height to provide a total shielding device height as low as 0.9 millimeter. But the shielding device 10 may have a typical height of 1.4 millimeter. Each sidewall 16, 18, 20, 22 includes two upstanding male detent elements 24, 26 with respective outwardly extending protrusions 28, 30. Furthermore, inwardly extending lip 32 is formed about the periphery of the top of sidewalls 16, 18, 20, 22 except for the areas where the material is used to form the upstanding male detent elements 24, 26. Support beam 40 is formed across the open top of frame 12. Typically, all parts of frame 12 are integral and formed from a single piece of the electrically conductive sheet metal.

The lid 14 is shown in more detail in FIGS. 4 and 5. In this particular illustrated embodiment, the lid 14 includes a generally planar top 42 and downwardly extending lip portions 44, 46, 48, 50 that fit outwardly adjacently flush to the frame's sidewalls 16, 18, 20, 22, respectively, in the installed position. Slots 52, 54 are formed at the intersection of the planar top 42 and each downwardly extending lip portion 44, 46, 48, 50. As can be seen from FIGS. 4 and 5, slots 52, 54 extend into the lip portions 44, 46, 48, 50. Typically, slots 52, 54 would have a minimum width of 2.0 millimeters. As can be seen in FIG. 5, the portion of slots 52, 54 extending into lip portions 44, 46, 48, 50 has a central semi-circular cut-out portion 56, 58, respectively, for nesting with the outwardly extending protrusions 28, 30. Cut-outs can be formed on the lower edge of lid 14, aligned with slots 52, 54, respectively, for example, to help align the lid 14 during installation.

Figure 6:
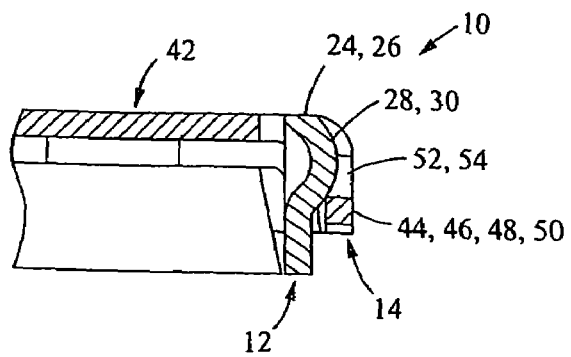
FIG. 6 is a cross-sectional view illustrating the engagement between the frame and the lid of the shielding device shown in FIG. 1A.

As shown in FIG. 6, in the installed position wherein frame 12 and lid 14 are engaged, upstanding male detent elements 24, 26 extend into slots 52, 54 and outwardly extending protrusions 28, 30 extend laterally into slots 52, 54 to detent engage the frame 12 and lid 14 to each other.

Figure 7:
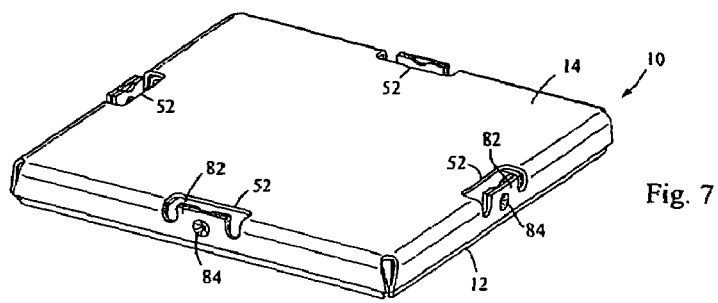
FIG. 7 is a perspective view of an engaged lid and frame of a shielding device according to a second exemplary embodiment.
Figure 8:
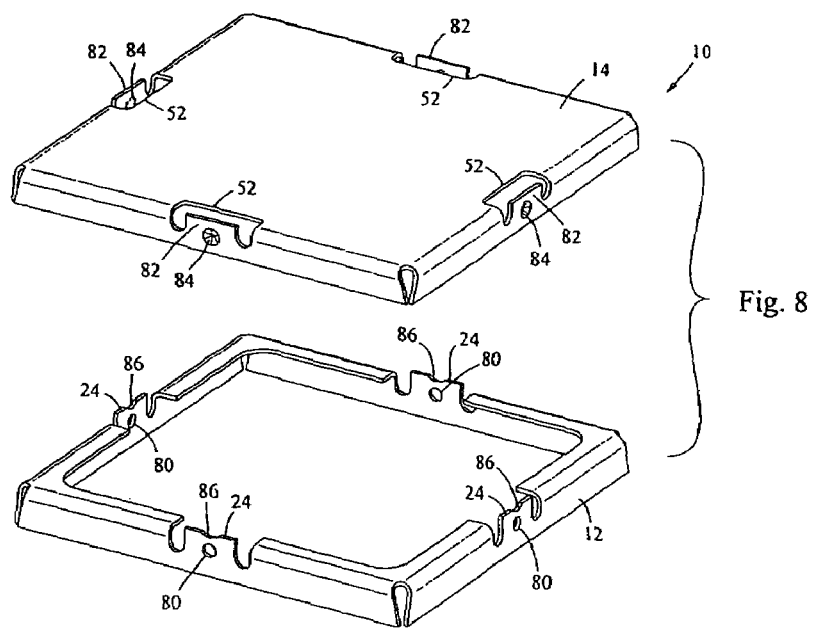
FIG. 8 is an exploded view of the lid and frame of the shielding device shown in FIG. 7.
Figure 9:
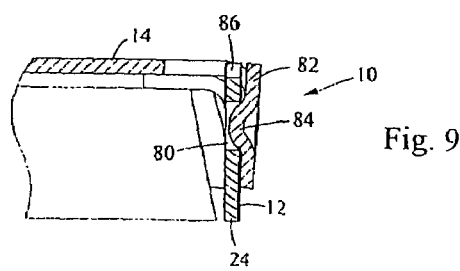
FIG. 9 is a cross-sectional view illustrating the engagement between the lid and frame of the shielding device shown in FIG. 7.

FIGS. 7 through 9 illustrate a second exemplary embodiment of a shielding device 10 embodying one or more aspects of the present disclosure. As shown for the second embodiment of the shielding device 10, at least one upstanding male detent element 24 is on each sidewall of frame 12, and at least one slot 52 corresponding to each upstanding male detent element 24 is on each sidewall of lid 14. Each upstanding male detent element 24 includes aperture 80. Each slot 52 has flange 82 adjacent thereto, including dimple 84. The detent configuration between the frame 12 and lid 14 is formed by flange 82 aligning outwardly adjacent from upstanding male element 24 and dimple 84 extending into aperture 80. Cut-outs 86 are on the top surface of upstanding male detent element 24 to aid in aligning dimples 84 during installation.

Figure 10:
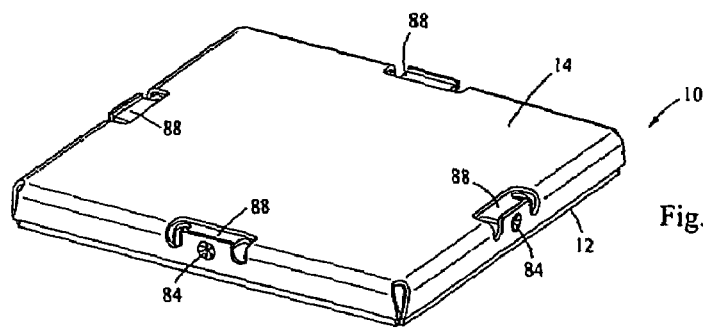
FIG. 10 is a perspective view of an engaged lid and frame of a shielding device according to a third exemplary embodiment.
Figure 11:
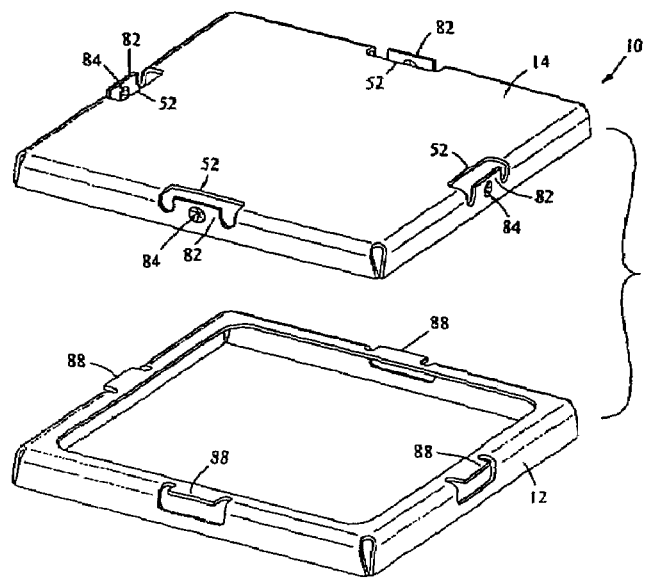
FIG. 11 is an exploded view of the lid and frame of the shielding device shown in FIG. 10.
Figure 12:
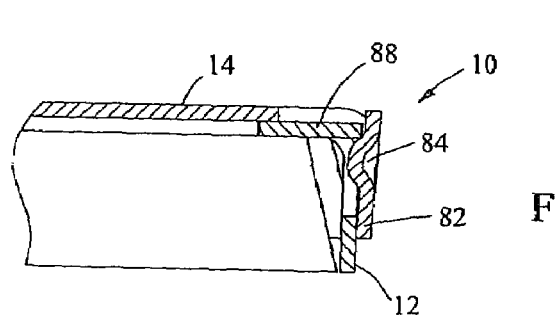
FIG. 12 is a cross-sectional view illustrating the engagement between the lid and frame of the shielding device shown in FIG. 10.
Figure 13:
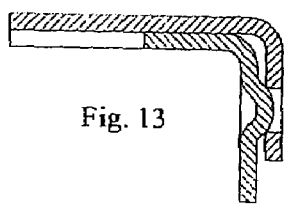
FIG. 13 is a cross-sectional view illustrating the engagement between a frame and lid of a prior art shielding device.
Figure 14:
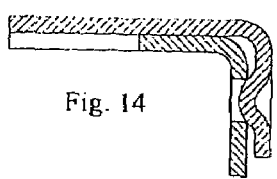
FIG. 14 is a cross-sectional view illustrating the engagement between a frame and lid of another prior art shielding device.

FIGS. 10 through 12 illustrate a third exemplary embodiment of a shielding device 10 embodying one or more aspects of the present disclosure. As shown for the third embodiment of the shielding device 10, the lid 14 is substantially identical to that of the second embodiment shown in FIGS. 7 through 9. But the frame's upstanding male detent elements 24 (from the second embodiment) have been replaced with horizontal flange 88 in the third embodiment. As shown in FIG. 12, the installed position of the third embodiment includes dimple 84 extending inwardly under horizontal flange 88.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order or performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A shielding enclosure for an electromagnetic device, the shielding enclosure comprising:
   a frame including side walls and an open top, the side walls including elements extending upwardly above the open top, the elements including lateral detent protrusions above the open top; and
   a lid to cover the open top of the frame, the lid including a downwardly extending lip which surrounds the frame and has semi-circular cut-out portions in which the lateral detent protrusions nest to engage the elements extending upwardly above the open top.

2. The shielding enclosure of claim 1, wherein, after the upwardly extending elements have engaged the semi-circular cut-out portions, the frame and the lid have a combined height not exceeding 1.4 millimeter.

3. The shielding enclosure of claim 1, wherein, after the upwardly extending elements have engaged the semi-circular cut-out portions, the frame and the lid have a combined height not exceeding 0.9 millimeter.

4. The shielding enclosure of claim 1, wherein the lateral detent protrusions are positioned with their centers above the height of the side walls, whereby the height of the side walls may be reduced to thereby provide an ultra-low profile shielding enclosure.

5. A shielding enclosure for an electromagnetic device, the shielding enclosure comprising:
   a frame including side walls and an open top, the side walls including elements extending upwardly above the open top, the elements having lateral detent protrusions thereon; and
   a lid to cover the open top of the frame, the lid including slots in which are received the elements extending upwardly above the open top of the frame, and a downwardly extending lip that surrounds the frame, the downwardly extending lip having cut-out portions in which the lateral detent protrusions nest, for engaging the elements extending upwardly above the open top of the frame.

6. The shielding enclosure of claim 5, wherein the cut-out portions comprise semi-circular cut-out portions in which the lateral detent protrusions nest.

7. The shielding enclosure of claim 5, wherein, after the elements extending upwardly above the open top of the frame have engaged the cut-out portions, the frame and the lid have a combined height not exceeding 1.4 millimeter.

8. The shielding enclosure of claim 5, wherein, after the elements extending upwardly above the open top of the frame have engaged the cut-out portions, the frame and the lid have a combined height not exceeding 0.9 millimeter.

9. The shielding enclosure of claim 5, wherein the lateral detent protrusions are positioned with their centers above the height of the side walls, whereby the height of the side walls may be reduced to thereby provide an ultra-low profile shielding enclosure.

10. A shielding enclosure for an electromagnetic device, the shielding enclosure comprising:
   a frame including side walls, an open top, and a fillet radius extending generally between the side walls and the open top, the side walls including upwardly extending elements that extend above the open top, the upwardly extending elements having cut-out portions therein;
   a lid to cover the open top of the frame, the lid including a downwardly extending lip that surrounds the frame, the downwardly extending lip having flanges extending upwardly from the lip, which flanges include lateral detent protrusions that nest within the frame's cut-out portions, for engaging the upwardly extending elements of the frame.

11. The shielding enclosure of claim 10, wherein the cut-out portions comprise semi-circular cut-out portions in which the lateral detent protrusions nest.

12. The shielding enclosure of claim 10, wherein the cut-out portions of the upwardly extending elements extend to a height that is above the frame's side walls and within the fillet radius, whereby the height of the side walls may be reduced to provide an ultra-low profile shield enclosure.

13. The shielding enclosure of claim 10, wherein, after the frame's upwardly extending elements have engaged the lid's cut-out portions, the frame and the lid have a combined height not exceeding 1.4 millimeter.

14. The shielding enclosure of claim 10, wherein, after the frame's upwardly extending elements have engaged the lid's cut-out portions, the frame and the lid have a combined height not exceeding 0.9 millimeter.

15. The shielding enclosure of claim 10, wherein the flanges are generally coplanar with the lip.

16. The shielding enclosure of claim 10, wherein the frame's upwardly extending elements are generally coplanar with the side walls of the frame.

17. The shielding enclosure of claim 10, wherein the frame's upwardly extending elements are aligned with the lid's flanges in a mating arrangement.

18. A method relating to an EMI shielding enclosure including a frame and a cover, the frame having side walls with elements that extend upwardly above the top of the frame, which elements have a first retaining feature therein, and the cover having a downwardly extending lip with flanges extending upwardly therefrom, which flanges have a second mating feature therein, the method comprising positioning the cover relative to the frame such that the first retaining feature of the frame's upwardly extending elements engage the second retaining feature of the flanges extending upwardly from the cover, to thereby retain the cover on the frame.

19. The method of claim 18, wherein the first retaining feature includes lateral detent protrusions, and wherein the second retaining feature include cut-out portions in which the lateral detent portions nest.

20. The method of claim 18, wherein the first retaining feature includes cut-out portions, and wherein the second retaining feature include lateral detent protrusions that nest within the cut-out portions.

* * * * *

UNITED STATES PATENT AND TRADEMARK OFFICE
CERTIFICATE OF CORRECTION

| | |
|---|---|
| PATENT NO. | : 7,285,732 B2 |
| APPLICATION NO. | : 11/495995 |
| DATED | : October 23, 2007 |
| INVENTOR(S) | : Vinokor et al. |

Page 1 of 1

It is certified that error appears in the above-identified patent and that said Letters Patent is hereby corrected as shown below:

Column 8, line 20: replace "second mating feature" with "second retaining feature"

Signed and Sealed this

Sixteenth Day of February, 2010

David J. Kappos
*Director of the United States Patent and Trademark Office*